United States Patent
Sommer et al.

(10) Patent No.: US 9,490,023 B2
(45) Date of Patent: Nov. 8, 2016

(54) MITIGATION OF RETENTION DRIFT IN CHARGE-TRAP NON-VOLATILE MEMORY

(71) Applicant: Apple Inc., Cupertino, CA (US)

(72) Inventors: Naftali Sommer, Rishon Le-Zion (IL); Avraham Poza Meir, Rishon Le-Zion (IL); Yoav Kasorla, Kfar Netar (IL); Eyal Gurgi, Petah-Tikva (IL)

(73) Assignee: Apple Inc., Cupertino, CA (US)

( * ) Notice: Subject to any disclaimer, the term of this patent is extended or adjusted under 35 U.S.C. 154(b) by 66 days.

(21) Appl. No.: 14/219,315

(22) Filed: Mar. 19, 2014

(65) Prior Publication Data

US 2015/0270007 A1 Sep. 24, 2015

(51) Int. Cl.
 *G11C 16/34* (2006.01)
 *G11C 7/02* (2006.01)
 *G11C 7/04* (2006.01)

(52) U.S. Cl.
 CPC ............ *G11C 16/3404* (2013.01); *G11C 7/02* (2013.01); *G11C 7/04* (2013.01)

(58) Field of Classification Search
 CPC ..... G11C 16/3404; G11C 16/28; G11C 7/02; G11C 7/04
 USPC .............................. 711/103; 365/185.09, 201
 See application file for complete search history.

(56) References Cited

U.S. PATENT DOCUMENTS

| | | | |
|---|---|---|---|
| 7,678,674 B1 * | 3/2010 | Sinha | H01L 21/26586 257/E21.147 |
| 8,050,086 B2 * | 11/2011 | Shalvi et al. | 365/185.02 |
| 8,446,778 B2 | 5/2013 | Kim | |
| 8,593,884 B2 | 11/2013 | Park et al. | |
| 8,806,106 B2 * | 8/2014 | Goss et al. | 711/103 |
| 2007/0121383 A1 * | 5/2007 | Chen et al. | 365/185.19 |
| 2009/0199074 A1 * | 8/2009 | Sommer | 714/763 |
| 2009/0319868 A1 * | 12/2009 | Sharon et al. | 714/763 |
| 2012/0124273 A1 * | 5/2012 | Goss et al. | 711/103 |
| 2014/0225181 A1 * | 8/2014 | Makala | H01L 29/7889 257/321 |
| 2015/0169398 A1 * | 6/2015 | Chunn et al. | |

\* cited by examiner

*Primary Examiner* — Son Dinh
*Assistant Examiner* — Jerome Leboeuf
(74) *Attorney, Agent, or Firm* — Meyertons, Hood, Kivlin, Kowert & Goetzel, P.C.

(57) ABSTRACT

A method includes storing data values in a group of memory cells that share a common isolating layer, by producing quantities of electrical charge representative of the data values at respective regions of the common isolating layer that are associated with the memory cells. A function, which relates a drift of the electrical charge in a given memory cell in the group to the data values stored in one or more other memory cells in the group, is estimated. The drift is compensated for using the estimated function.

20 Claims, 2 Drawing Sheets

MITIGATION OF RETENTION DRIFT IN CHARGE-TRAP NON-VOLATILE MEMORY

FIELD OF THE INVENTION

The present invention relates generally to data storage, and particularly to methods and systems for mitigating retention drift in non-volatile memory.

BACKGROUND OF THE INVENTION

Charge-Trap (CT) Non-Volatile Memory (NVM) typically stores quantities of electrical charge that are representative of data values in an isolating layer, such as a nitride layer. Drifting of the stored charge may degrade the memory performance. Several techniques are known in the art for reducing drift effects in NVM.

For example, U.S. Pat. No. 8,593,884, whose disclosure is incorporated herein by reference, describes a data retention method that includes sampling a plurality of non-volatile memory devices included in a data storage device to detect retention information for each of the nonvolatile memory devices in response to a request of a host. Sampling data is output from the data storage device to the host based on a result of the sampling. The host determines whether to perform a retention operation on each of the non-volatile memory devices based on the sampling data, and performing the retention operation on each of the nonvolatile memory devices based on a result of the determination.

As another example, U.S. Pat. No. 8,446,778, whose disclosure is incorporated herein by reference, describes a Charge-Trap Flash memory device that is capable of preventing data retention fail by ensuring a data retention margin. A selected memory cell is programmed using a program voltage. The selected memory cell is verified using a first program verify voltage. Data retention states of the selected memory cell having passed the program verify step are verified using a retention verify voltage. A read step of determining a program pass or fail by reading data of the selected memory cell having passed the retention verify step is performed using a read voltage.

SUMMARY OF THE INVENTION

An embodiment of the present invention that is described herein provides a method including storing data values in a group of memory cells that share a common isolating layer, by producing quantities of electrical charge representative of the data values at respective regions of the common isolating layer that are associated with the memory cells. A function, which relates a drift of the electrical charge in a given memory cell in the group to the data values stored in one or more other memory cells in the group, is estimated. The drift is compensated for using the estimated function.

In some embodiments, estimating the function includes estimating one or more drift coefficients that quantify respective contributions of the one or more other memory cells to the drift. In an embodiment, estimating the function includes assessing the function based on a parameter of the memory cells. The parameter of the memory cells may include at least one parameter type selected from a group of types consisting of a wear level, an elapsed time since programming, a temperature and a temperature integral over time of the memory cells.

In another embodiment, estimating the function includes assessing the function based on one or more readout operations performed in memory cells outside the group. In yet another embodiment, estimating the function includes assigning a set of memory cells to serve as reference cells, and assessing the function based on measurements performed on the reference cells.

In some embodiments, compensating for the drift includes reading the data values from the one or more other memory cells, and compensating for the drift using the estimated function and the read data values. In a disclosed embodiment, compensating for the drift includes reading the data values from the group multiple times using respective different read thresholds, and combining readout results obtained using the different read thresholds depending on the function and on the read data values.

In another embodiment, storing the data values includes encoding the data values with an Error Correction Code (ECC), and compensating for the drift includes computing soft decoding metrics based on the function and on the read data values, and decoding the ECC using the soft decoding metrics. In yet another embodiment, compensating for the drift includes adjusting, based on the function and on the read data values, bit-line voltages used during readout from the memory cells.

There is additionally provided, in accordance with an embodiment of the present invention, apparatus including a memory and storage circuitry. The memory includes a group of memory cells that share a common isolating layer. The storage circuitry is configured to store data values in the group of the memory cells by producing quantities of electrical charge representative of the data values at respective regions in the common isolating layer that are associated with the memory cells, to estimate a function, which relates a drift of the electrical charge in a given memory cell in the group to the data values stored in one or more other memory cells in the group, and to compensate for the drift using the estimated function.

The present invention will be more fully understood from the following detailed description of the embodiments thereof, taken together with the drawings in which:

DETAILED DESCRIPTION OF EMBODIMENTS

Overview

Figure 1:
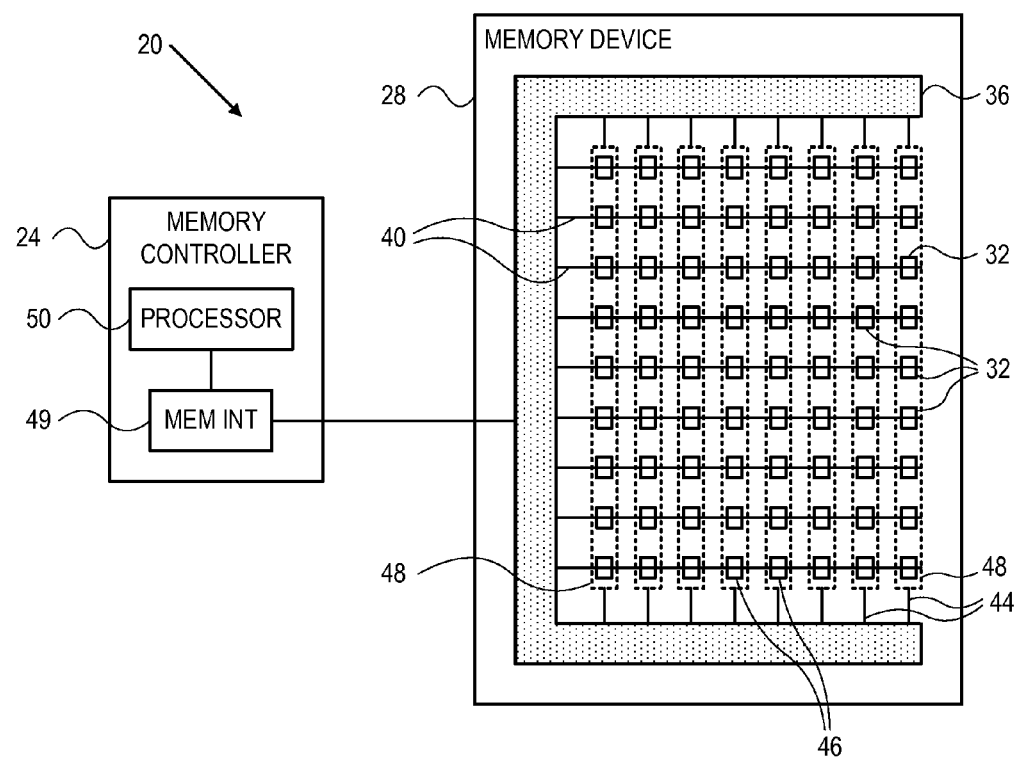
FIG. 1 is a block diagram that schematically illustrates a memory system, in accordance with an embodiment of the present invention.

Embodiments of the present invention that are described herein provide improved methods and systems for mitigating charge retention drift in non-volatile memory cells. In some embodiments, a memory controller stores data values in a group of memory cells that share a common isolating layer. The memory cells may comprise, for example, a group of Charge-Trap (CT) Flash memory cells along a bit line, sharing a common nitride layer.

The data values are stored by creating respective quantities of electrical charge in respective regions of the common isolating layer that are associated with the memory cells. In practice, however, the stored electrical charge tends to spread over time in the common isolating layer and drift from the designated regions of the memory cells. This effect is referred to herein as "charge retention drift" or "retention drift." Unless accounted for, retention drift may cause read errors and loss of data.

In the disclosed embodiments, the memory controller carries out a process that estimates and compensates for the retention drift. The extent of drift in a given memory cell typically depends on the charge quantities (and thus the data values) stored in other memory cells in the group, and in particular neighboring memory cells. In some embodiments, the memory controller estimates a function, which relates the charge drift in a given memory cell to the data values stored in one or more other memory cells in the group, and compensates for the drift using the estimated function.

In some embodiments, the memory controller estimates the function by estimating one or more drift coefficients, each coefficient quantifying the impact of a respective memory cell on the retention drift in the given memory cell. In alternative embodiments, the memory controller may use more complex functions, e.g., non-linear functions.

Several example techniques for estimating the drift coefficients, and for compensating for the retention drift using the drift coefficients, are described herein. For example, the memory controller may estimate the drift coefficients from parameters of the memory cells such as wear level, elapsed time since programming, temperature or temperature integral over time. The memory controller may alternatively estimate the drift coefficients based on successful readout attempts in other memory cell groups, or based on measurements performed in a set of reference memory cells.

The memory controller may compensate for the retention drift, based on the drift coefficients and the data values of neighboring memory cells, in various ways. Example compensation schemes include, for example, combining multiple readout results using different read thresholds, adjusting soft decoding metrics used for decoding the read data, or adjusting the bit-line voltages used for readout.

In summary, the methods and systems described herein estimate and compensate for charge drift in CT and other non-volatile memory cells. By using the disclosed techniques, non-volatile memory is capable of storing data for longer periods of time and with improved reliability.

System Description

FIG. 1 is a block diagram that schematically illustrates a memory system 20, in accordance with an embodiment of the present invention. System 20 can be used in various host systems and devices, such as in computing devices, cellular phones or other communication terminals, removable memory modules (e.g., "disk-on-key" or "Flash drive" devices), Solid State Disks (SSD), digital cameras, music and other media players and/or any other system or device in which data is stored and retrieved.

System 20 comprises a memory controller 24 that stores data in a memory device 28. Memory device stores the data in an array of analog memory cells 32. In the context of the present patent application and in the claims, the term "analog memory cell" is used to describe any memory cell that holds a continuous, analog value of a physical parameter, such as an electrical voltage or charge.

In the embodiments described herein, the data is stored in the memory cells by creating respective charge levels in a common isolating layer. One typical example is CT NAND Flash memory. The techniques described herein can be used, however, with various other types of memory, such as CT NOR Flash, silicon-oxide-nitride-oxide-silicon (SONOS) memory, tantalum-aluminum-oxide-nitride-oxide-silicon (TANOS) memory, metal-oxide-nitride-oxide-silicon (MONOS) memory, or any other suitable memory type that involves an isolating layer. The memory cell array may be two-dimensional (2-D) or three-dimensional (3-D).

The charge levels stored in the cells and/or the analog voltages or currents written into and read out of the cells are referred to herein collectively as analog values, storage values or analog storage values. Although the embodiments described herein mainly address threshold voltages, the methods and systems described herein may be used with any other suitable kind of storage values.

System 20 stores data in memory cells 32 by programming the cells to assume respective memory states, which are also referred to as programming levels. The programming levels are selected from a finite set of possible levels, and each level corresponds to a certain nominal storage value. For example, a 2 bit/cell MLC can be programmed to assume one of four possible programming levels by writing one of four possible nominal storage values into the cell.

Memory device 28 comprises a reading/writing (R/W) unit 36, which converts data for storage in the memory device to analog storage values and writes them into memory cells 32. In alternative embodiments, the R/W unit does not perform the conversion, but is provided with voltage samples, i.e., with the storage values for storage in the cells. When reading data out of memory cells 32, R/W unit 36 converts the storage values of memory cells 32 into digital samples having an integer resolution of one or more bits. Data is typically written to and read from the memory cells in groups that are referred to as pages. In some embodiments, the R/W unit can erase a group of cells 32 by applying one or more negative erasure pulses to the cells.

In the example of FIG. 1, memory cells 32 are arranged in multiple rows and columns that correspond to word lines 40 and bit lines 44, respectively. The memory cells of each row are connected by a respective word line 40, and the memory cells of each column are connected by a respective bit line 44. In the present context, the term "row" is used in the conventional sense to mean a group of memory cells that are fed by a common word line, and the term "column" means a group of memory cells fed by a common bit line. The terms "row" and "column" do not connote a certain physical orientation of the memory cells relative to the memory device.

In the present example, the memory cells along each bit line 44 are regarded as a respective cell group 48. Each cell group 48 shares a common isolation layer (e.g., nitride layer) that is used for storing electrical charge levels that represent the data values stored in the memory cells. The embodiments described herein mitigate drifting of the electrical charge in this common layer, as will be described in detail below.

Memory controller 24 comprises an interface 49 for communicating with memory device 28, and a processor 50 that carries out the various processing tasks of the memory controller. The disclosed techniques can be carried out by memory controller 24, by R/W unit 36, or both. Thus, in the present context, memory controller 24 and R/W unit 36 are referred to collectively as storage circuitry that carries out the disclosed techniques. Memory controller 24 may be implemented in hardware, e.g., using one or more Application-Specific Integrated Circuits (ASICs) or Field-Programmable Gate Arrays (FPGAs). Alternatively, the memory controller may comprise a microprocessor that runs suitable software, or a combination of hardware and software elements.

The configuration of FIG. 1 is an example system configuration, which is shown purely for the sake of conceptual clarity. Any other suitable memory system configuration can also be used. For example, although the example of FIG. 1 shows a single memory device, in alternative embodiments memory controller 24 may control multiple memory devices 28. Elements that are not necessary for understanding the principles of the present invention, such as various interfaces, addressing circuits, timing and sequencing circuits and debugging circuits, have been omitted from the figure for clarity.

In the example system configuration shown in FIG. 1, memory device 28 and memory controller 24 are implemented as two separate Integrated Circuits (ICs). In alternative embodiments, however, the memory device and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which the memory array is disposed. Further alternatively, some or all of the functionality of memory controller 24 can be implemented in software and carried out by a processor or other element of the host system. In some embodiments, the host and memory controller may be fabricated on the same die, or on separate dies in the same device package.

In some embodiments, processor 50 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

Charge Retention Drift in CT Memory

Figure 2:
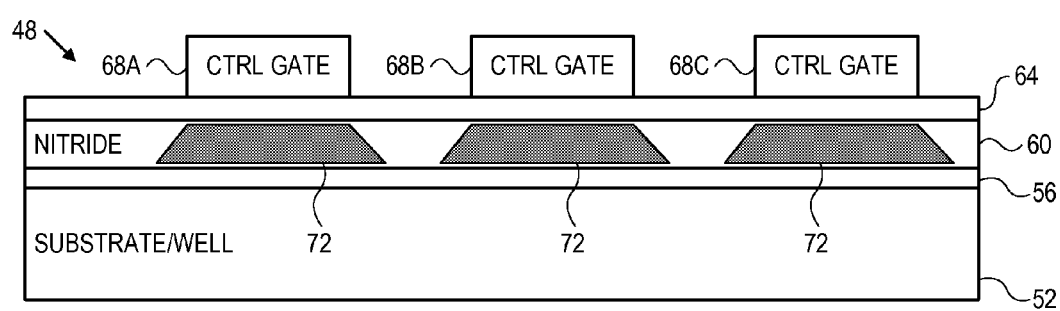
FIG. 2 is a schematic cross section of a group of Charge-Trap (CT) Flash memory cells, in accordance with an embodiment of the present invention.

FIG. 2 is a schematic cross section of an example group 48 of Charge-Trap (CT) Flash memory cells 32, in accordance with an embodiment of the present invention. The structure of group 48 may be planar, as in legacy two-dimensional 2-D NAND Flash memory devices, or vertical as proposed in emerging 3-D Flash structures.

In the present example, a substrate 52 typically comprises Silicon or Poly-silicon. An assembly on substrate 52 comprises an oxide layer 56 (referred to as tunnel oxide), a nitride layer 60 (or any other suitable blocking or isolation layer), and another oxide layer 64 (referred to as gate oxide). Multiple control gates 68 are placed on oxide layer 64. The present example shows only three control gates denoted 68A . . . 68C, for the sake of clarity. The control gates are typically made of Poly-silicon. The region of layer 60 underneath each control gate 68 functions as a non-volatile memory cell 32. Data is stored in such a memory cell by storing a certain quantity of electrical charge 72 in nitride layer 60, underneath the control gate. The quantity (and/or polarity) of electrical charge 72 is indicative of the data value stored in the memory cell.

Typically, R/W unit 36 programs a given memory cell with charge 72 by applying one or more high voltage pulses (e.g., ~20V) to control gate 68 of that cell. The control gates of the neighboring cells are typically biased with lower voltage (e.g., ~5V) during programming. The R/W unit typically reads a given memory cell by applying a suitable read voltage to the control gate of the cell, applying to the other control gates pass voltages that cause the other cells to conduct, and sensing the conductivity of the cascade of memory cells using voltage or current sensing. R/W unit 36 typically erases a memory cell by applying a high negative voltage to the control gate.

Multiple memory structures of this sort can be used to form a two- or three-dimensional array of memory cells: Multiple groups 48 of memory cells 32 (such as the cascade shown in FIG. 2) are connected to respective bit lines 44, and corresponding control gates 68 in the multiple groups are connected to respective word lines 40.

As can be seen in FIGS. 1 and 2, the memory cells in each group 48 (i.e., the memory cells of each bit line 44) store their respective electrical charge quantities in the common nitride layer 60. In practice, electrical charge 72 tends to spread over time in layer 60, i.e., drift from the designated regions below the control gates. Gradually, as the charge spreads, the threshold voltages of the memory cells change and the retention performance of the memory is degraded, causing read errors and loss of data. This effect is referred to as "charge retention drift" or "retention drift."

It is important to distinguish between the charge retention drift effect addressed by the disclosed techniques, and electrical field coupling (sometimes referred to as cross-coupling) between memory cells. Charge retention drift involves actual movement of electrical charge (electrons or holes) from the designated areas of the memory cells, and thus occurs primarily in memory structures in which the charge of multiple cells is stored in a common layer. Electrical field coupling, on the other hand, affects the threshold voltage levels of memory cells without involving actual movement of electrical charge. Electrical field coupling is common, for example, in floating-gate memory structures. Moreover, retention drift is typically dependent on time and on the endurance level of the memory cells, whereas electrical-field cross-coupling is typically not dependent on such factors.

Techniques for Mitigating Retention Drift

The extent of retention drift in a given memory cell typically depends on the amounts of electrical charge 72 stored in other cells (particularly neighboring cells) in the same group 48. Put in another way, the extent of retention drift in a given memory cell typically depends on the data values stored in other cells (e.g., neighboring cells) in the same bit line 44. For example, a memory cell whose neighbor cells on the same bit line are both erased will typically exhibit more retention drift than a memory cell whose neighbors are both programmed. Thus, it is possible to quantify the extent or severity of retention drift in a given cell as a function of the data values of other cells in the same group 48.

In some embodiments, memory controller 24 carries out a process that compensates for the retention drift in memory cells 32. In some embodiments, the process can be divided into two main parts: Estimating the extent of the drift, and accounting for the estimated drift in the readout process. Typically, memory controller 24 estimates a function, which gives the extent of retention drift in a memory cell as a function of the data values stored in one or more other memory cells in the same bit line. The memory controller compensates for the drift based on the estimated function and on the actual data values of the neighboring cells.

In the embodiments described herein, the function comprises one or more drift coefficients. Each drift coefficient is indicative of the relation between the data value of a respective memory cell in group 48 and the retention drift in the given memory cell. For example, when considering only the effect of the two nearest neighbors, the function may comprise two coefficients—One coefficient indicative of the contribution of each nearest neighbor cell to the total drift. More complex functions may consider a larger number of memory cells, and thus may comprise a larger number of coefficients.

The disclosed techniques, however, are not limited to the use of drift coefficients, and can be used with any other suitable function. When using a coefficient-based function, the underlying assumption is that the impact of a neighboring cell is linearly-proportional to the charge level or programming level of the neighboring cell, and that the contributions of multiple neighboring cells are additive and can be summed to estimate the total retention drift. These assumptions are often true but not always. In alternative embodiments, memory controller 24 may use various other functions, e.g., non-linear functions, to estimate the impact of neighboring cell charge levels on the retention drift. Such functions can be defined, for example, by simulation or empirical measurements.

In some embodiments, the same function (e.g., set of drift coefficients) is valid for the entire memory. For example, the impact of the nearest neighbor cells on the drift of an affected cell may be similar across the memory, i.e., for any affected cell regardless of bit line or location along the bit line. In other embodiments, the memory controller may define different functions for different scenarios of affected cells (e.g., depending on whether the affected cell is the first cell in a bit line, the last cell in a bit line or otherwise, depending on whether the affected cell is located in the first bit line in the array, in the last bit line in the array or otherwise, or depending on any other suitable classification).

Figure 3:
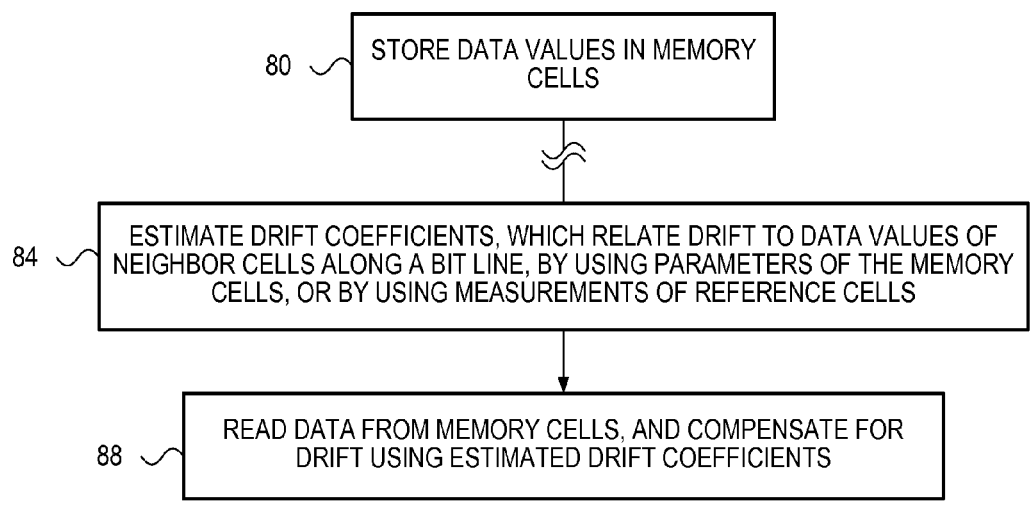
FIG. 3 is a flow chart that schematically illustrates a method for mitigating charge retention drift in CT Flash memory, in accordance with an embodiment of the present invention.

FIG. 3 is a flow chart that schematically illustrates a method for mitigating charge retention drift in CT Flash memory, in accordance with an embodiment of the present invention. The method begins with memory controller 24 storing data values in memory cells 32 of memory device 28, at a storage step 80. At a drift estimation step 84, the memory controller estimates one or more drift coefficients that quantify the extent of drift in a given cell as a function of the data values of one or more other cells in the same bit line. At a compensation step 88, memory controller 24 reads data from a group 48 of memory cells 32, and compensates for the effect of retention drift in the read cells. The compensation for a given memory cell is based on the drift coefficients estimated at step 84 above, and based on the data values of one or more other memory cells in the bit line.

Memory controller 24 may estimate the drift coefficients in various ways. In some embodiments, the memory controller calculates, or has access to, parameters of the memory cells that are indicative of the drift coefficients. One example of such a parameter is the wear level of the memory cells, e.g., the number of Programming and Erasure (P/E) cycles that the memory cells have gone through. Typically, heavily-cycled memory cells will exhibit stronger retention drift than fresh cells that did not undergo many P/E cycles.

Another parameter that can be used for estimating the drift coefficients is the time that elapsed since the memory cells were programmed. Another example parameter is the temperature of the memory. Yet another parameter is an integral of the temperature over time, which is typically indicative of the cell wear level. Further aspects of using temperature-time integral functions are addressed, for example, in U.S. Pat. No. 8,599,592, whose disclosure is incorporated herein by reference.

In various embodiments, memory controller 24 may estimate the drift coefficients using any of the above-described parameters, using any suitable combination of parameters, and/or using any other suitable parameters of the memory cells.

Additionally or alternatively, memory controller 24 may estimate the drift coefficients for a certain group of memory cells based on other groups of memory cells that were read successfully. Further additionally or alternatively, memory controller 24 may assign a group of memory cells to serve as reference cells 46. In such embodiments, the memory controller stores known data values in the reference cells, subjects them to known conditions (e.g., known number of P/E cycles), measures the retention drift in the reference cells, and uses these measurements to estimate drift coefficients for other cell groups. In some embodiments, the reference cells may be programmed using different programming parameters than the cells used for storing data. For example, the reference cells can be programmed with finer resolution in comparison with normal cells, e.g., using a smaller magnitude increment between adjacent programming pulses.

The estimation schemes described above are chosen purely by way of example. In alternative embodiments, memory controller 24 may estimate the drift coefficients (or more generally—the drift functions) using any other suitable scheme.

Having estimated the drift coefficients, memory controller 24 may use the estimated coefficients in various ways to compensate for the drift. For example, in some embodiments the memory controller reads the memory cells multiple times using different read thresholds, and combines the multiple readout results in a manner that depends on the data values of the neighbor cells and on the drift coefficients. For example, the memory controller may decide to omit a certain set of readout results, or to assign different weights to different sets of readout results, based on the data values of the neighbor cells and on the drift coefficients.

In other embodiments, memory controller 24 encodes the stored data using a suitable Error Correction Code (ECC). When reading data from the memory device, the memory controller computes soft decoding metrics for the read data values, and decodes the ECC in a soft decoding process based on the soft decoding metrics. One example of soft decoding metrics is Log Likelihood Ratios (LLRs).

In such embodiments, memory controller 24 may adjust the soft decoding metrics based on the data values of the neighbor cells and on the drift coefficients. Typically, the memory controller will assign lower-confidence metrics to data values that were read from cells that suffer from severe drift, and vice versa.

In other embodiments, memory controller 24 and/or R/W unit 36 may adjust the bit-line enable voltages (which is applied to respective bit lines 44 during readout) based on the data values of the neighbor cells and on the drift coefficients. When reading an entire word line 40 simultaneously, this technique provides specific cell-by-cell compensation to the read thresholds, depending on the neighbor cells of each cell being read.

Further alternatively, memory controller 24 may compensate for retention drift using the estimated drift functions using any other suitable technique.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A method, comprising:
storing data values in a group of memory cells that share a common isolating layer that includes a continuous nitride layer included in each memory cell of the group of memory cells, wherein the data values are stored by producing respective quantities of electrical charge representative of the data values at respective regions of the continuous nitride layer, and wherein each of the respective regions corresponds to one memory cell of the group of memory cells;
estimating a function, which relates a drift of the electrical charge in a given memory cell in the group to the data values stored in one or more other memory cells in the group; and
compensating for the drift using the estimated function;
wherein the drift of the electrical charge in the given memory cell in the group of the memory cells corresponds to the electrical charge drifting out of the respective region to other areas within the common isolating layer.

2. The method according to claim 1, wherein estimating the function comprises estimating one or more drift coefficients that quantify respective contributions of the one or more other memory cells to the drift.

3. The method according to claim 1, wherein the one or more other memory cells in the group of the memory cells include a nearest neighboring memory cell.

4. The method according to claim 1, wherein estimating the function comprises assessing the function based on a parameter of the group of memory cells, and wherein the parameter of the group of memory cells comprises at least one parameter type selected from a group of types consisting of a wear level, an elapsed time since programming, a temperature and a temperature integral over time of the group of memory cells.

5. The method according to claim 1, wherein estimating the function comprises assessing the function based on one or more readout operations performed in memory cells outside the group.

6. The method according to claim 1, wherein estimating the function comprises assigning a set of memory cells to serve as reference cells, and assessing the function based on measurements performed on the reference cells.

7. The method according to claim 1, wherein compensating for the drift comprises reading the data values from the one or more other memory cells, and compensating for the drift using the estimated function and the read data values.

8. The method according to claim 7, wherein compensating for the drift comprises reading the data values from the group multiple times using respective different read thresholds, and combining readout results obtained using the different read thresholds depending on the function and on the read data values.

9. The method according to claim 7, wherein storing the data values comprises encoding the data values with an Error Correction Code (ECC), and wherein compensating for the drift comprises computing soft decoding metrics based on the function and on the read data values, and decoding the ECC using the soft decoding metrics.

10. The method according to claim 7, wherein compensating for the drift comprises adjusting, based on the function and on the read data values, bit-line voltages used during readout from the one or more other memory cells.

11. An apparatus, comprising:
a memory, including a group of memory cells that share a common isolating layer, wherein the common isolating layer includes a continuous nitride layer included in each memory cell of the group of memory cells; and
storage circuitry, which is configured to:
store data values in the group of the memory cells by producing respective quantities of electrical charge representative of the data values at respective regions in the continuous nitride layer, and wherein each of the respective regions corresponds to one memory cell of the group of memory cells;
estimate a function, which relates a drift of the electrical charge in a given memory cell in the group to the data values stored in one or more other memory cells in the group; and
compensate for the drift using the estimated function, wherein the drift of the electrical charge in the given memory cell in the group of the memory cells corresponds to the electrical charge drifting out of the respective region to other areas within the common isolating layer.

12. The apparatus according to claim 11, wherein the storage circuitry is further configured to estimate the function by estimating one or more drift coefficients that quantify respective contributions of the one or more other memory cells to the drift.

13. The apparatus according to claim 11, wherein the one or more other memory cells in the group of the memory cells include a nearest neighboring memory cell.

14. The apparatus according to claim 11, wherein the storage circuitry is further configured to estimate the function based on a parameter of the group of memory cells, and wherein the parameter of the group of memory cells comprises at least one parameter type selected from a group of types consisting of a wear level, an elapsed time since programming, a temperature and a temperature integral over time of the group of memory cells.

15. The apparatus according to claim 11, wherein the storage circuitry is further configured to estimate the function based on one or more readout operations performed in memory cells outside the group.

16. The apparatus according to claim 11, wherein the storage circuitry is further configured to assign a set of memory cells to serve as reference cells, and to assess the function based on measurements performed on the reference cells.

17. The apparatus according to claim 11, wherein the storage circuitry is further configured to compensate for the drift by reading the data values from the one or more other memory cells, and compensating for the drift using the estimated function and the read data values.

18. The apparatus according to claim 17, wherein the storage circuitry is further configured to compensate for the drift by reading the data values from the group multiple times using respective different read thresholds, and combining readout results obtained using the different read thresholds depending on the function and on the read data values.

19. The apparatus according to claim 17, wherein the storage circuitry is further configured to encode the stored data values with an Error Correction Code (ECC), and to compensate for the drift by computing soft decoding metrics based on the function and on the read data values, and decoding the ECC using the soft decoding metrics.

20. The apparatus according to claim 17, wherein the storage circuitry is further configured to compensate for the drift by adjusting, based on the function and on the read data values, bit-line voltages used during readout from the one or more other memory cells.

* * * * *